United States Patent
Hunt et al.

(10) Patent No.: US 6,372,364 B1
(45) Date of Patent: Apr. 16, 2002

(54) NANOSTRUCTURE COATINGS

(75) Inventors: Andrew T. Hunt, Atlanta; Henry A. Luten, III, Doraville, both of GA (US)

(73) Assignee: MicroCoating Technologies, Inc., Atlanta, GA (US)

( * ) Notice: Subject to any disclaimer, the term of this patent is extended or adjusted under 35 U.S.C. 154(b) by 0 days.

(21) Appl. No.: 09/376,625

(22) Filed: Aug. 18, 1999

(51) Int. Cl.[7] .............................. B32B 3/00; B05C 5/00; B05D 5/12
(52) U.S. Cl. .................... 428/607; 118/301; 118/406; 156/344; 427/99; 427/124; 427/255.25; 427/256; 428/624; 428/628; 428/629; 428/632; 428/636; 428/637; 428/640; 428/646; 428/647; 428/648; 428/651; 428/652; 428/656; 428/658; 428/665; 428/669; 428/670; 428/671; 428/672; 428/673; 428/674; 428/675; 428/680; 428/687; 428/901; 428/924; 428/926; 428/938
(58) Field of Search ........................ 428/607, 624, 428/628, 629, 632, 636, 637, 640, 646–648, 651, 652, 656, 658, 665, 669, 670–675, 680, 687, 901, 924, 926, 938; 118/301, 406; 156/344; 427/99, 124, 255.25, 256

(56) References Cited

U.S. PATENT DOCUMENTS

| | | |
|---|---|---|
| 3,969,199 A | 7/1976 | Berdan et al. |
| 3,984,598 A | 10/1976 | Sarazin et al. |
| 4,357,395 A | 11/1982 | Lifshin et al. |
| 4,383,003 A | 5/1983 | Lifshin et al. |
| 4,431,710 A | 2/1984 | Lifshin et al. |
| 4,568,413 A | 2/1986 | Lifshin et al. |
| 5,057,372 A | 10/1991 | Imfeld et al. |
| 5,322,975 A | 6/1994 | Nagy et al. |
| 5,505,808 A | 4/1996 | Hallman et al. |
| 5,652,021 A | 7/1997 | Hunt et al. |
| 5,747,180 A * | 5/1998 | Miller et al. ................. 428/629 |
| 5,858,465 A | 1/1999 | Hunt et al. |
| 5,863,604 A | 1/1999 | Hunt et al. |

FOREIGN PATENT DOCUMENTS

| | | |
|---|---|---|
| EP | 0976847 A2 | 4/1998 |
| WO | WO9705994 | 2/1997 |
| WO | WO9851485 | 11/1998 |

* cited by examiner

*Primary Examiner*—Deborah Jones
*Assistant Examiner*—Robert R. Koehler
(74) *Attorney, Agent, or Firm*—Alfred H. Muratori; Wayne E. Nacker

(57) ABSTRACT

A thin film product having a nanostructured surface, a laminate product including the thin film and a temporary substrate opposite the nanostructured surface, a laminate product including the thin film and a final substrate attached to the nanostructured surface and a method of producing the thin film products. The thin film is particularly useful in the electronics industry for the production of integrated circuits, printed circuit boards and EMF shielding. The nanostructured surface includes surface features that are mostly smaller than one micron, while the dense portion of the thin film is between 10–1000 nm. The thin film is produced by coating a temporary substrate (such as aluminum foil) with a coating material (such as copper) using any process. One such method is concentrated heat deposition or a combustion, chemical vapor deposition process. The resulting thin film provides a high level of adhesion to a final substrate, by embedding the nanostructures with the material of the final substrate (such as an epoxy resin). The surface of the thin film adjacent the temporary substrate substantially conforms to the substrate surface and has a relatively low peel strength. In this manner, the temporary substrate is easily removed from the thin film after attaching the opposite nanostructured side of the thin film to the final substrate with a resulting, higher peel strength.

23 Claims, 4 Drawing Sheets

NANOSTRUCTURE COATINGS

The present invention involves a nanostructure, coating surface for improved adhesion to materials. More specifically, the invention is a laminate product produced by applying a coating having a roughened surface onto a substrate, and the method of producing this product.

BACKGROUND OF THE INVENTION

In the thin film industry, it is often desirable to have a thin film attached or coated onto a thicker, substrate of the same or different material. To increase adhesion to the substrate, the surface of the thin film contacting the substrate may be roughened by etching or other processes. These processes are difficult to control and can reduce the integrity of the thin film itself, unless the film is relatively thick. In addition, the etching processes involved use environmentally unsafe, waste materials that must be cleaned, recycled and/or disposed of. One such application of thin films involves producing a copper thin film by deposition copper onto a first temporary substrate, and then transferring the thin film onto a final substrate for the production of integrated circuits, printed circuit boards and other electronic applications. In order to apply the thin film to the final product, the thin film must be capable of being easily peeled away from the temporary substrate, and at the same time must adhere to the temporary substrate well enough to remain in place during handling. The temporary substrate (often aluminum or copper) is then peeled off of the copper thin film, leaving the thin film of copper on the final substrate. While there are prior art methods of forming these thin films on temporary substrates, some of these methods require a vacuum environment, which prohibits the use of some materials and makes cooling of the substrate difficult. The present invention overcomes these disadvantages and others by using combustion chemical vapor deposition CCVD or concentrated heat deposition CHD to directly coat the thin film onto the temporary substrate. This results in a thin film that is firmly supported by a substrate for handling purposes, yet easily peeled from this substrate for use. In addition, the product produced using the disclosed methods produces a roughened exposed surface having nanostructure features that interact with the final substrate, thereby producing a stronger adhesion between the thin film and the final permanent substrate and product, while providing a desired thin continuous layer.

U.S. Pat. No. 3,969,199, issued on Jul. 13, 1976 to Berdan et al., discloses a method of coating aluminum with a strippable copper deposit. This method involves pre-treating the aluminum carrier with an alkaline, aqueous, alkali metal zincate solution containing a minor amount of water-soluble salt. The salt is selected from iron, cobalt and nickel. This temporary coating is then removed using acid. By pre-treating the aluminum carrier in this manner, the initial copper electroplated to the aluminum consists of a very high density of small copper nuclei. This results in peel strengths not greater than 2 lbs. per inch width. While the pretreating methods disclosed in this patent may be useful with the present invention, there is no discussion concerning the roughening of the exposed copper surface.

Metal-clad laminates are the subject of U.S. Pat. No. 3,984,598, issued on Oct. 5, 1976 to Sarazin et al. These laminates comprise a metal coating about 1 to 20 microns thick that is deposited on a substrate, after treating the substrate with a release agent. One example given is coating stainless steel with a copper coating after treating the stainless steel with a silane release agent. The upper side of the copper is treated by passing a high currant density and oxidizing the surface using heat. The oxidized surface is treated with a silane bonding agent and is then bonded to a glass epoxy resin laminate. The stainless steel is then removed. While a high degree of adhesion between the copper coating and the glass epoxy resin laminate is achieved using this method, a number of steps are involved, resulting in a costly process. In contradistinction, the present invention roughens the exposed copper (or other material) surface during the coating operation, thus reducing costs as well as the effect on the environment. Furthermore, the larger features associated with the oxidized surface of the copper reduces the overall conductivity per unit weight of the copper, as opposed to the product of the present invention that simply roughens a pure copper surface with smaller features, enabling thinner films, thereby requiring less copper and thus faster etching times In U.S. Pat. No. 4,357,395, issued on Nov. 2, 1982., U.S. Pat. No. 4,383,003, issued on May 10, 1983 and U.S. Pat. No. 4,431,710, issued on Feb. 14, 1984, all to Lifshin et al., a number of transfer lamination methods and products are disclosed. The most pertinent of these methods and products is illustrated in FIG. 6 of the '395 Patent. An aluminum carrier sheet is first treated with a release agent (such as silicone dioxide, silicon oxide or soda-lime window glass). A copper coating is then applied by sputtering or other coating technique resulting in a thin film (up to 25 microns) copper layer having a relatively small grain size. The exposed surface of the copper coating is then treated electrolytically or by other methods to alter the morphology of the copper surface. This increases the mechanical interlocking of the copper when bonded to another surface. One such method involves treating the copper surface in a baths of progressively weaker concentrations of copper sulfate. The details (grain or relief sizes) of the roughened copper surface are not disclosed, however, peel strengths on the order of 8 pounds per inch are achieved. As with other known methods, the methods discussed in these patents involve many steps to produce the final product. In addition, while the final product does include a roughened copper surface, the features of the surface are non-uniform and larger when compared to the nanostructure surface of the present invention. This can result in areas having greater adhesion than other areas, as well as areas with varying current carrying capabilities. By providing a surface with nanostructure features, the present invention provides uniform adhesion across the entire surface using a minimum of additional copper or other coating material.

U.S. Pat. No. 5,057,372, issued on Oct. 15, 1991 to Imfeld et al., is directed to a multi-layer film and laminate for use in producing printed circuit boards. The multi-layer film acts as a protective carrier sheet for a metal foil such as copper. An adhesive layer is provided on the surface of the carrier sheet. The adhesive layer is heated or softened to create a releasable bond between the copper foil and the carrier sheet. After the film/foil laminate is placed in a heated press for lamination or molding to the prepreg, the carrier sheet is easily removed. Peel test between the film and foil are between 0.4 pounds/in-width and 0.005 pounds/in-width and preferably between 0.1 pounds/in-width and 0.01 pounds/in-width. This patent is directed mainly to the interface between the film and the foil, and therefore, details concerning the exposed copper surface, or the copper foil production method used, are not disclosed.

An easily peelable or chemically strippable laminate is described in U.S. Pat. No. 5,332,975, issued on Jun. 21, 1994 to Nagy et al. The laminate includes an aluminum layer with an aluminum oxide layer. A thin layer of copper foil is then electroplated on the aluminum oxide, and a thin layer of brass is electroplated on the copper. This results in a copper deposit, which exhibits a low porosity, while the brass layer provides a thermal barrier between the polymeric substrate and the copper foil. The aluminum oxide layer acts as a release agent for the aluminum carrier. The peel strength between the copper and aluminum layers is dependent on the thickness of the aluminum oxide layer and preferably ranges between 0.1 and 0.5 lb./in. While the brass layer is cited as minimizing peel strength degradation between the copper layer and the polymeric substrate, there is no discussion of surface roughening of the copper surface.

None of the above references and patents, taken either singly or in combination, is seen to describes the instant invention as claimed.

BRIEF DESCRIPTION OF THE INVENTION

The present invention is directed to a thin film conductive product having enhanced adhesive properties, as well as a laminate product with this thin film product embedded therein or thereon. As described above, one use of these thin films is in the circuit board industry wherein the product is a thin film of conductive material such as copper that is first deposited onto a temporary substrate of aluminum (or alternatively, copper). In a further embodiment, the product of the present invention is the thin film is overlain with prepreg or other dielectric circuit board material, with the temporary substrate removed. This dielectric material can have the thin film conductor on one side or both sides for use by circuit board or other manufacturers. In yet a further embodiment, the product of the present invention is a laminate product that includes the thin film attached to dielectric circuit board material with an additional conductive material coated on the thin film. Etching or any known, circuit making method can then be used to create discrete conductor lines or areas to produce a final product as described below. It should be As noted that the present invention is useful with a large number of different materials and applications. The examples described below involve coating a thin film of copper onto a temporary aluminum substrate, as is often used in circuit board production, however, these are simply examples and are not intended to be limiting. The basic objective is to produce a high level of adhesion (greater than 4 lbs./in-width and preferably greater than 6 lbs./in-width) between the conductor and the dielectric insulator (normally epoxy based), while producing a relatively low peel strength (less than 2 lbs./in-width) between the copper foil and the temporary aluminum substrate. Of course, the peel strength between the thin film conductor and aluminum should be high enough (greater than 0.05 lbs./in-width), such that the two do not separate during handling.

To achieve the above objectives, the examples of the present invention use a concentrated heat deposition CHD technique that produces a copper thin film with very low porosity and smooth surface adjacent the aluminum substrate. At the same time, this technique produces an inherent roughening and high porosity of the exposed surface of the copper. This roughened surface is not the typical surface produced in prior art methods such as oxidation or etching, which result in substantially thicker and thinner areas of the foil with numerous features greater than one micron across. In contradistinction, the deposition method used to produce the thin film of the instant invention results in a surface containing a somewhat uniform distribution of mostly nanostructures. The term "nanostructures" is intended to refer to surface features with diameters or heights in the sub-micron range. These nanostructures produce a uniform adhesion, while reducing the amount of material used to assist in the adhesion between the foil and the final substrate. In addition, once removed from the temporary substrate, the resulting thin film has a very smooth upper surface that closely conforms to the surface of the temporary substrate on which it was deposited. When chemically roughening the surface, a thicker copper film is needed to help minimize pinholes being formed by over-treatment. With the present invention, continuous base coatings as thin as 10–1000 nm can be grown with surface structures several times larger attached thereto. Chemical processing yields surface structures nearly the same or less in height then the dense layer base.

Many other deposition techniques may be used to produce the thin film of the present invention, depending on the materials involved. One such technique is combustion chemical vapor deposition CCVD, as described in applicant's own U.S. Pat. Nos. 5,652,021, 5,858,465 and 5,863,604, all of which are hereby incorporated by reference. Some materials (copper in particular), however, are more difficult to deposit using CCVD, as a low oxygen environment is required. For the deposition of these materials, a non-combustion energy source can be provided. These heat sources can be hot gasses, heated tubes, radiant energy, microwave and energized photons (such as infrared or laser) to name a few. Further details of a suitable deposition technique are disclosed in co-pending U.S. patent application Ser. No. 09/067,975 entitled "APPARATUS AND PROCESS FOR CONTROLLED ATMOSPHERE CHEMICAL VAPOR DEPOSITION", and hereby incorporated by reference. The examples provided below in the detailed description section were produced using hot gasses as the energy source. A precursor solution containing copper is atomized, by passing the solution through a small diameter tube. This atomization technique is more fully described in co-pending U.S. patent application Ser. No. 08/691,853, now U.S. Pat. No. 5,997,956, entitled "CHEMICAL VAPOR DEPOSITION AND POWDER FORMATION USING THERMAL SPRAY WITH NEAR SUPERCRITICAL AND SUPERCRITICAL FLUID SOLUTIONS" and hereby incorporated by reference. A second tube surrounds the small tube and hot gasses are fed into the larger tube to provide the energy required for the atomization. The larger tube truncates in an extended collar that conforms to and is essentially parallel with the substrate to be coated. As the hot gasses exit the large tube they are traveling at a high rate of speed (50–100 feet/minute and greater). The collar routes the hot gasses in a radial direction thereby forming a barrier zone that prevents contamination (such as oxidation) by blocking atmospheric gasses from entering the deposition zone.

Accordingly, it is a first object of the invention to produce a thin film having a structured surface for increased adhesion to a substrate.

It is another object of the invention to provide a laminate including a thin film on a temporary substrate wherein the thin film has an exposed, structured surface providing greater adhesion to a final substrate than the adhesion between the thin film and the temporary substrate.

It is still another object of the invention to produce a thin film on a substrate in an open atmosphere environment, without degradation of the thin film by atmospheric gasses.

It is yet a further object of the invention to produce a thin film having a dense thickness less than 200 nm that also exhibits a high degree of adhesion to a final substrate.

It is still another object of the invention to provide a copper thin film on an aluminum or copper substrate for protection during handling, wherein the thin film can be easily transferred to an insulating substrate for use in producing printed circuit boards, integrated circuits and other electronic products.

These and other objects of the present invention will become readily apparent upon further review of the following specification and drawings.

DETAILED DESCRIPTION OF THE PREFERRED EMBODIMENTS

The present invention may be understood more readily by reference to the following It is to be understood that the terminology used herein is for the purpose of describing particular embodiments only and is not intended to be limiting. It must be noted that, as used in the specification and the appended claims, the singular forms "a," "an" and "the" include plural referents unless the context clearly dictates otherwise.

The publications, patents and patent applications referenced in this application are hereby incorporated by reference in their entireties into this application, in order to more fully describe the state of the art to which this invention pertains.

Figure 1:
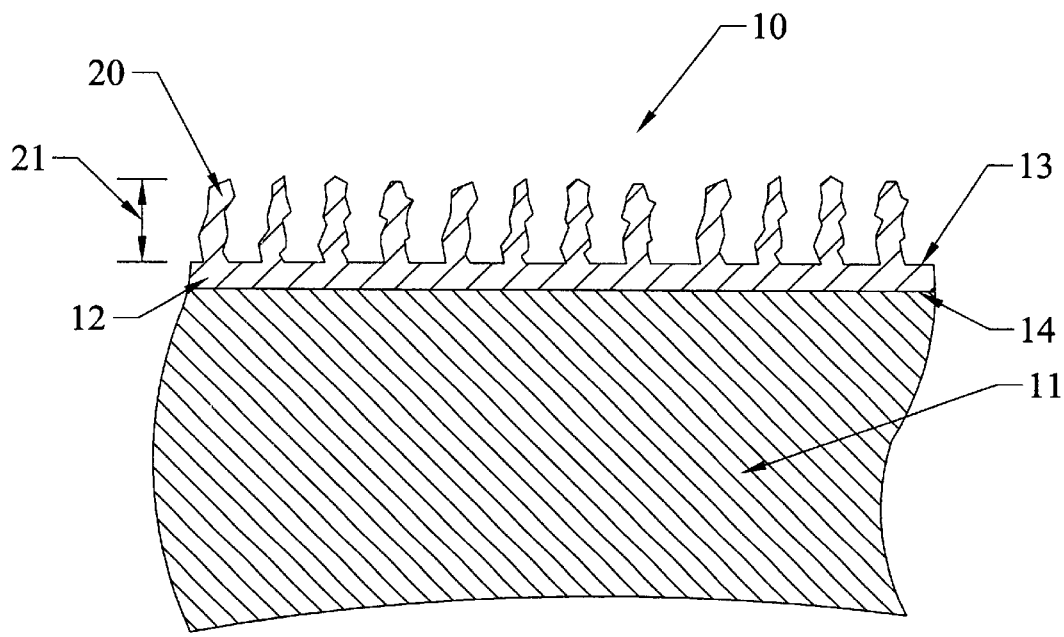
FIG. 1 is a diagrammatic view of a top portion of a substrate having a thin film with a nanostructured surface deposited thereon, in accordance with the present invention.

In FIG. 1, a cross-sectional diagrammatic view of the laminate product 10 of the present invention is illustrated. A temporary substrate 11 has a thin film coating 12 deposited thereon. While the thickness of the substrate 11 can vary over a wide range depending on the material used, to allow flexibility the thickness is usually between 0.5–5 mil. By providing a flexible product, handling is considerably easier, as the product can be rolled up for transport. As with the substrate, the thickness of the thin film 12 can also be produced in a range of thicknesses, although typical values are between 10 nm and one micron for the dense portion. More preferably, the dense base has a thickness less than 500 nm, specifically between 20 to 400 nm, while the thin film has a thickness between 200 nm and several microns. As the main thrust of the present invention involves details of the exposed surface 13 of the thin film 12, the actual materials that make up the substrate 11 and the thin film 12, can be chosen depending on the application. The thin film material should enable plating, and preferably electroplating, in which case it should be conductive. As previously discussed, the laminate is particularly suited for use in the circuit board industry, and therefore likely materials include copper for the thin film 12, and aluminum, nickel or copper an organic material for the substrate 11. Other materials suitable for deposition by the disclosed process include metals such as nickel, zinc, tin, tungsten, platinum, gold, silver and alloys thereof, as well as conductive oxides such as ITO, LSC and $BiRuO_3$. The thin film 12 is deposited on the substrate 11 such that the peel strength between the two is between 0.05 and 2.0 lbs./in-width and preferably between 0.1 and 1.5 lbs./in-width. In order to facilitate this peelability, an intermediate layer may be provided at the interface 14. This intermediate layer may be an oxide (such as aluminum oxide when substrate 11 is aluminum) or a silica or other oxide deposition may be made prior to the thin film deposition. Many known methods of creating this peelable interface may be used, or alternatively, the thin film may be directly deposited. Whichever method is used, the critical issue is that the peel strength between the thin film 12 and the substrate 11 must be less than the peel strength between the thin film and the final substrate (attached to exposed surface 13). This is described in greater detail below.

As can be also be seen in FIG. 1, surface 13 includes a plurality of nanostructures 20 having a height 21 above the continuous surface 13 of between 50 nm and 5 microns the structured surface 13 being away from the carrier substrate 11. In the preferred embodiment, most of these nanostructures 20 have a diameter of less than one micron. In an embodiment a significant amount of the surface structure heights 21 are greater than the thickness of the continuous base layer, and preferably more than twice the base thickness. The size of these nanostructures is very significant as they provide a roughened surface on extremely thin films that has not been known prior to the inception of the present invention. While the thickness of thin film 12 is shown schematically as similar to the nanostructures 20, this is oftentimes not the case. In fact, in some cases the continuous portion of the thin film 12 may only be 200 nm thick, while the nanostructures 20 may rise 1000 nm (or one micron) above the exposed surface 13 of thin film 12. Such conditions are shown in the examples below. When the thin film 12 is to be transferred to another substrate (such as prepreg or fiberboard in the production of circuit boards), the material of the final substrate fills the spaces around the nanostructures 20. This results in a stronger bond between the thin film 12 and the final substrate (not shown) then exists between the thin film 12 and the temporary substrate 11. The stronger bond created by the nanostructures 20 allows the temporary substrate 11 (and any intermediate layer at the interface 14) to be peeled off of the thin film 12, leaving an exposed smooth thin film surface firmly bonded to one side of the final substrate.

Figure 2:
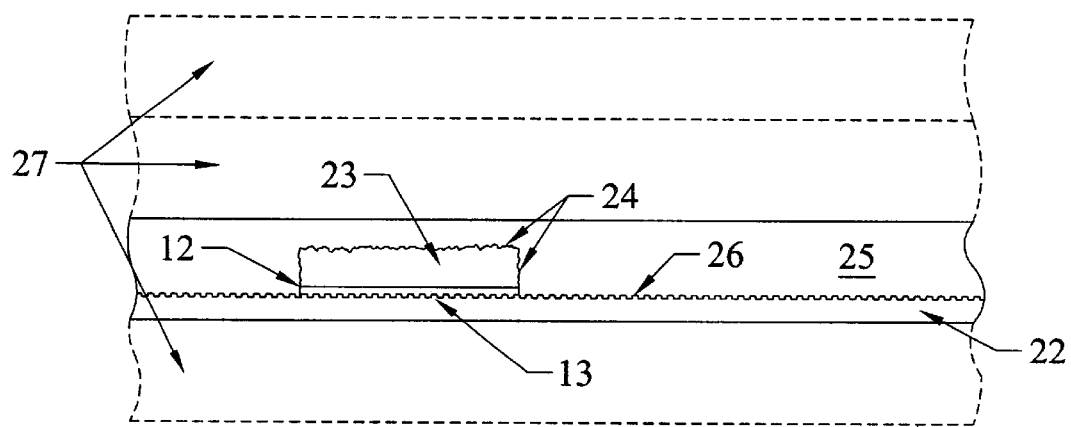
FIG. 2 is a cross-sectional diagrammatic view of a laminate product of the present invention including a thin film deposited on a final substrate.

FIG. 2 illustrates a laminate product of the present invention that includes the thin film 12 of FIG. 1, after having been removed from the temporary substrate 11. The thin film 12 has been attached to a final insulating substrate 22 (usually an epoxy resin). This intermediate product could be processed in a separate facility and delivered to others. The attachment is enhanced by embedding the nanostructures on surface 13, thus the insulated material 22 has the structured surface 13 of the conductive material integrated on a surface, as previously described. An additional conductive material 23 (such as another layer of copper) has been coated on thin film 12 using electroplating or other suitable techniques, and may be pattern plated up, only in desired areas or lines, thus forming distinct conductive traces in the conductive material layer. By adding additional conductive material to the dense base layer, the original thickness of less than 500 nm can be increased to the desired thickness. The undesired portions of the conductive layers 12 and 23 have been removed using a rapid etching technique to remove unplated thin conductor. The etching leaves a much rougher surface 24, having features larger than one micron. Surface 26 is the reverse of the nanostructure surface that is formed be embedding the nanostructures with the insulating layer 22 and then removing that portion of the thin film 12 using the etchant. A second insulating layer 25 is then placed over the top of this assembly to complete the encapsulation, as is known in electronic fabrication technology. Surface 26 may provide additional strength between the insulating layers 22 and 25 where they are in contact, in the same manner as the nanostructures on thin film 12. These laminates can be stacked to create a product with nanostructured surface conductor line circuits made of several, electrically interconnected layers 27, as is well known in the art.

Figure 3:
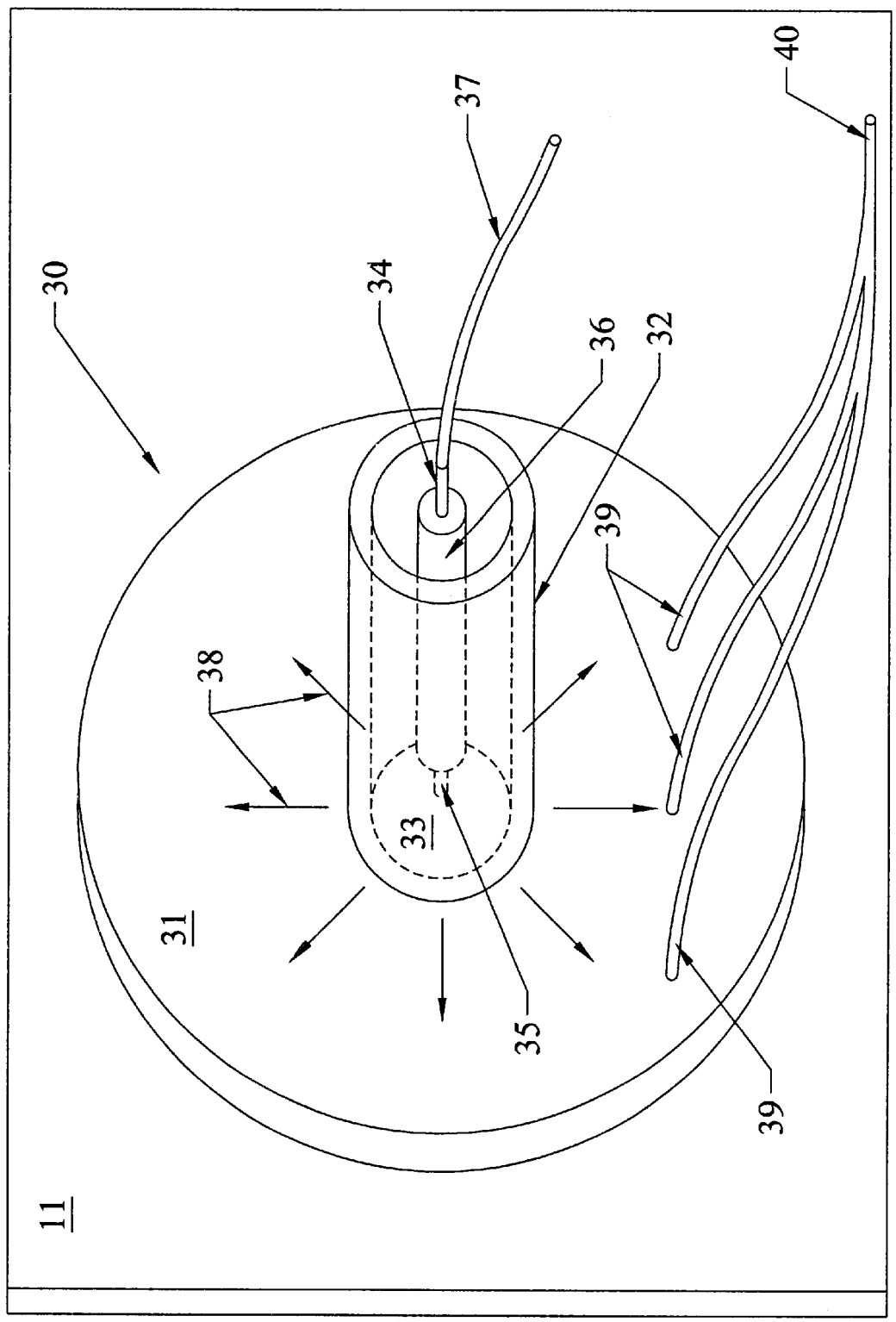
FIG. 3 is a diagrammatic view of one type of apparatus that can be used to produce the laminate product of FIG. 1.

FIG. 3 depicts one type of apparatus 30 that can be used to coat a substrate 11 with the thin film and nanostructures of the present invention. The precursor solution containing the constituents is fed (using a suitable pump as is known in the art), into a supply tube 37. The opposite end of supply tube 37 is attached to a small diameter tube or needle 34. Tube 34 is mounted within a ceramic sleeve 36 that provides strength and support to the small diameter tube 34. A larger diameter tube 32 surrounds the small diameter tube 34 and the ceramic sleeve 36. Hot gasses (as high as 500° C.) are fed into tube 32, thereby heating the sleeve 36, tube 34 and the portion of the substrate 11 in deposition zone 33. As the precursor solution exits the distal end 35 of tube 34, it experiences a sudden drop in pressure and atomizes. As previously stated, some features of this atomization process are also described in co-pending U.S. patent application Ser. No. 08/691,853. The atomized precursor then contacts the substrate 11 in the deposition zone 33 and forms the coating of the present invention. The apparatus 30 is moved over the surface of the substrate until the entire area to be coated has been covered. This can be done in several different patterns. In addition, depending on the desired thickness of the coating, several passes may be made. A cooling jet of gas or liquid (not shown) can be directed to the rear surface of the substrate 11 to provide cooling of the substrate 11 when necessary. This cooling jet is moved over the surface at a point directly opposite apparatus 30, or alternatively it may proceed or follow the position of apparatus 30 for optimal effect.

When it is desired to form coatings of certain materials (copper being the most prevalent), the presence of oxygen in the deposition zone 33 causes oxidation and degradation of the thin film. To avoid this condition, a collar 31 is attached to the end of the tube 32 that is close to substrate 11. Collar 31 closely conforms to and is parallel to substrate 11. While substrate 11 is shown as planar, it could just be curved, grooved, etc., and collar 31 would be constructed to conform to the surface of substrate 11. The hot gasses exiting tube 32 must escape between the substrate 11 and the collar 31 and therefore travel in a radial direction (as shown by arrows 38) upon leaving deposition zone 33. The flowing hot gases thereby form a barrier zone that prevents the entry of oxygen and other detrimental gasses into the deposition zone 33 from the surrounding atmosphere. The hot gasses used in the following examples include a mixture of hydrogen (as a reducing gas) and nitrogen, although other gasses such as argon can be used depending on the materials of the substrate and thin film. Near the bottom of collar 31, three ports 39 are provided to supply purging gases from supply line 40.

Materials that can benefit from this oxygen free, deposition environment include, but are not limited to nitrides, carbides and borides. Other elements susceptible to oxidation include aluminum, silicon, titanium, tin and zinc.

In addition to the deposition process and apparatus described above, other types of processes and apparatus may be used depending on the optimal conditions for certain materials. For example, while combustion chemical vapor deposition CCVD may not be appropriate for deposition of titanium (as the flame provides an oxygen source), it may be useful when depositing other materials such as platinum, gold and silver. Furthermore, to avoid the presence of oxygen when necessary heat sources other than combustion can be employed such as: electrical resistance heating; induction heating; microwave heating; RF heating; hot surface heating; laser heating; infrared heating and others. The above referenced U.S. patent application Ser. No. 09/067,975 provides greater detail concerning the different materials and the appropriate deposition techniques therefor.

EXAMPLE 1

A first sample was made of copper thin film deposited on a 6"×6" aluminum foil (1–3 mil) substrate using the apparatus of FIG. 3. The precursor solution used contained 0.90 g of Cu $(2EH)_2$ dissolved in 100 mL of reagent alcohol. The solution was fed into tube 34 at a rate of 2.0 ml/min. A mixture of heated hydrogen (as a reducing gas) and nitrogen gasses was fed into tube 32 at flow rates of at 1.5 liters/min. and 94 liters/min., respectively. Additional nitrogen purging gasses were supplied to ports 39 at a flow rate of 117 liters/min. The temperature as measured at the end 35 of tube 34 was recorded at 500° C. Cooling air was directed at the back of the substrate 11 at a rate of 25 liters/min. The motion program controlling the movement of the apparatus 30 across the front of the substrate (as well as the motion of the cooling air across the back of the substrate), involved scanning across the X dimension of the substrate, and then offsetting by $\frac{1}{16}$" in the Y dimension. This was continued from the bottom of the substrate to the top and then back to the bottom, for a total of 8 passes. The process took a total of 120 minutes with an average scan rate of 38.4"/min. The resulting coating included nanostructures ranging in height from approximately 200 nm to almost two microns. Electrical resistance of the copper thin film was measured at 1.6 Ω/square. Conductivity as low as one MΩ/square was shown to enable electroplating, but less than 100 Ω/square is preferred.

EXAMPLE 2

Figure 4:
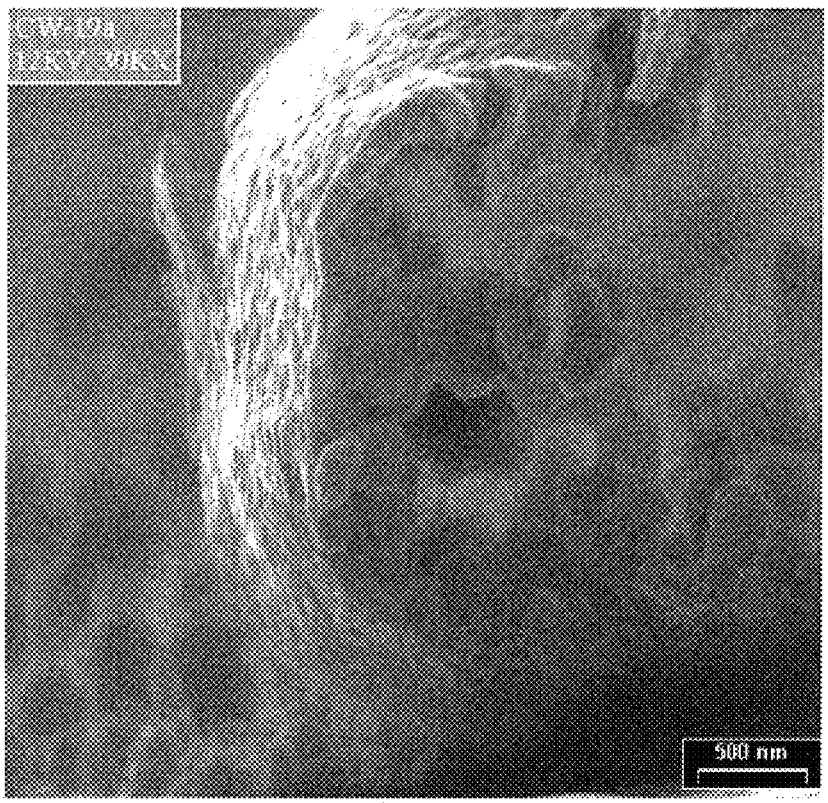
FIG. 4 is a photomicrograph of a cross section of a sample of copper thin film peeled off of an aluminum substrate which it was originally deposited on, showing the smooth bottom surface of the thin film.

FIG. 4 is a microphotograph of a second sample of copper thin film deposited on a 6"×6" aluminum foil (1–3 mil) substrate using the apparatus of FIG. 3. The precursor solution used contained 0.90 g of Cu $(2EH)_2$ dissolved in 100 mL of reagent alcohol. The solution was fed into tube 34 at a rate of 2.0 ml/min. A mixture of heated hydrogen (as a reducing gas) and nitrogen gasses was fed into tube 32 at flow rates of 1.5 liters/min and 94 liters/min, respectively. Additional nitrogen purging gasses were supplied to ports 39 at a flow rate of 117 liters/min. The temperature as measured at the end 35 of tube 34 was recorded at 500° C. Cooling air was directed at the back of the substrate 11 at a rate of 25 liters/min. The motion program controlling the movement of the apparatus 30 across the front of the substrate (as well as the motion of the cooling air across the back of the substrate), involved scanning across the X dimension of the substrate, and then offsetting by $\frac{1}{16}$" in the Y dimension.

This was continued from the bottom of the substrate to the top and then back to the bottom, for a total of 8 passes. The process took a total of 90 minutes with an average scan rate of 51.2"/min. As can be seen in FIG. 4, the resulting coating included nanostructures ranging in height from approximately 200 nm to about one micron. Electrical resistance of the copper thin film was measured at approximately 15 Ω/square.

EXAMPLE 3

Figure 5:
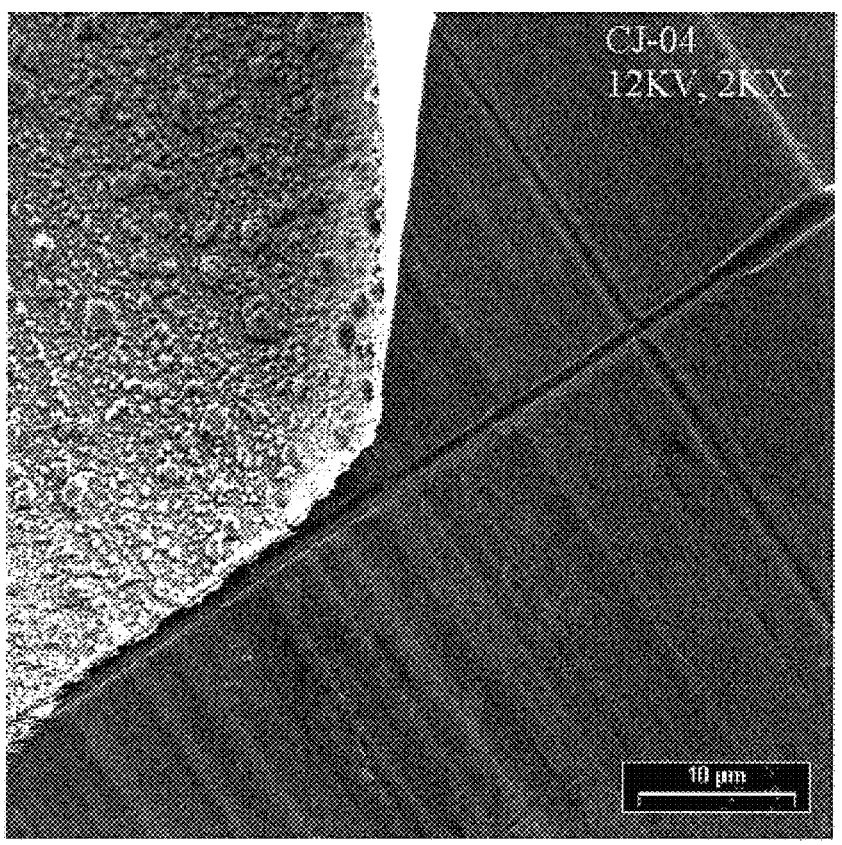
FIG. 5 is a photomicrograph of another sample of copper thin film deposited on an aluminum substrate, and partially peeled off of the substrate.
Figure 6:
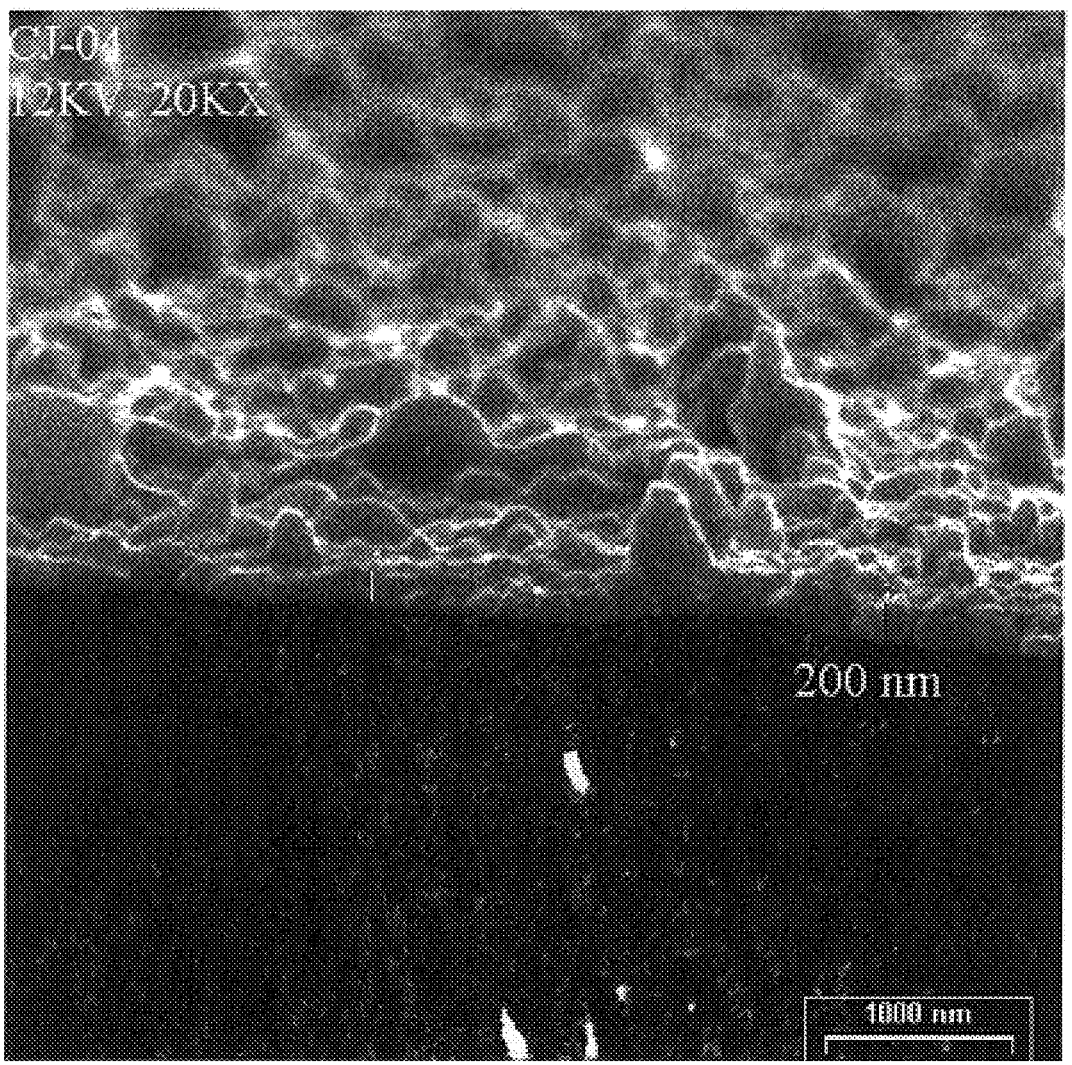
FIG. 6 is a photomicrograph of a cross section of the sample of copper thin film peeled from the aluminum substrate shown in FIG. 5.

FIGS. 5 and 6 are microphotographs of a third sample of copper thin film deposited on a 3"×3" aluminum foil (1–3 mil) substrate using the apparatus of FIG. 3. The precursor solution used contained 0.45 g of Cu $(2EH)_2$ dissolved in 100 mL of reagent alcohol. The solution was fed into tube 34 at a rate of 2.0 ml/min. A mixture of heated hydrogen (as a reducing gas) and nitrogen gasses was fed into tube 32 at flow rates of 1.5 liters/min and 44.3 liters/min, respectively. Additional nitrogen purging gasses were supplied to ports 39 at a flow rate of 44.3 liters/min. The temperature as measure at the end 35 of tube 34 was recorded at 500° C. Cooling air was directed at the back of the substrate 11 at a rate of 35 liters/min. The motion program controlling the movement of the apparatus 30 across the front of the substrate (as well as the motion of the cooling air across the back of the substrate), involved scanning back and forth across the X dimension of the substrate, and then offsetting by 1/16" in the Y dimension. This was continued from the bottom of the substrate to the top, for a single pass (two passes for each Y position). The process was repeated at twice the scan rate as a reducing pass. The process took a total of 31 minutes with an average scan rate of 4.65"/min. on the first pass and an average scan rate of 9.29"/min. on the reducing pass. In FIG. 6 it is apparent that the resulting coating had a continuous thickness of approximately 200 nm and included nanostructures not exceeding a height of about one micron. In FIG. 5 it can be seen that the copper thin film closely mimicked the surface of the aluminum foil.

The above examples are indicative that thin films having nanostructures less than one micron in height can be produced using the methods disclosed herein. In combination with the detailed description, the examples are intended to enable those skilled in the art to make the nanostructure coatings and use the methods disclosed herein. The invention is not intended to be limited by the above description, other than as set forth in the following claims.

What is claimed is:

1. A product including a thin film of a first material on a carrier substrate of a second material, said thin film having a mostly nanostructured exposed surface for improved interaction with adjacent materials, wherein said thin film is releasable from said carrier substrate.

2. The product of claim 1 further comprising a layer of a third material, said third material assisting in releasing said thin film from said carder substrate.

3. The product of claim 2 wherein said third material is aluminum oxide.

4. A product including a thin film of a first material on a carrier substrate of a second material, said thin film having a mostly nanostructured exposed surface for improved interaction with adjacent materials, wherein said thin film has a thickness between 200 nm and several microns and wherein said thin film has a dense base thickness of 20 to 400 nm.

5. A product including a thin film of a first material on a carrier substrate of a second material said thin film having a mostly nanostructured exposed surface for improved interaction with adjacent materials, wherein said first material is the same as said second material.

6. The product of claim 5 wherein said second material is copper.

7. The product of claim 5 wherein said second material is nickel.

8. A product including a thin film of a first material on a carrier substrate of a second material, said thin film having a mostly nanostructured exposed surface for improved interaction with adjacent materials, wherein said first material is copper.

9. A product including a thin film of a first material on a carrier substrate of a second material, said thin film having a mostly nanostructured exposed surface for improved interaction with adjacent materials, wherein said first material is a different material than said second material and said second material is aluminum.

10. A product including a thin film of a first material on a carrier substrate of a second material, said thin film having a mostly nanostructured exposed surface for improved interaction with adjacent materials, wherein said first material is a different material than said second material and said second material is organic.

11. A product including a thin film of a first material on a carrier substrate of a second material, said thin film having a mostly nanostructured exposed surface for improved interaction with adjacent materials, wherein said thin film has a resistance of less than one hundred ohm per square.

12. A method of coating a substrate with a thin film, said method comprising:
    feeding a solution containing constituents of the thin film therein, into a first end of a small diameter tube;
    feeding hot gasses into a large diameter tube surrounding the small diameter tube, the hot gasses thereby heating the small diameter tube and the solution within the small diameter tube; and
    releasing the solution from a second end of the small diameter tube, the solution atomizing as it is released and the second end of the tube being in close proximity to the substrate; wherein
    the large tube has a collar substantially conforming and parallel to the substrate, the collar thereby forming a deposition zone and a barrier zone such that the hot gasses heat the substrate in the deposition zone and provide the barrier zone about the deposition zone; and
    the barrier zone prohibits atmospheric gases from entering the deposition zone.

13. A conductive thin film material, said conductive material comprising a dense base having a thickness of less than 500 nm and a surface with a mostly nanostructured surface.

14. The material of claim 13 wherein the structured surface is at least twice as high as the dense base is thick.

15. The material of claim 13 wherein the conductive material is attached to a carrier with the mostly nanostructured surface away from the carrier.

16. A composite material including a conductive thin film material, said conductive material comprising a dense base having a thickness of less than 500 nm and a surface with a mostly nanostructured surface morphology and an insulated material, said insulated material having the mostly nanostructured surface of the conductive material integrated on a surface.

17. The composite material of claim 16 further comprising additional conductive material with mostly nanostructured surfaces and additional insulated material, wherein the mostly nanostructured surfaces of the additional conductive material is integrated on two surfaces of the additional insulated material.

18. A laminated product containing at least one conductive material layer, said conductive layer having a surface with a mostly nanostructured surface morphology, wherein the thickness of a dense base of the conductive layer is less than 500 nm prior to any plated material being added.

19. The laminated product of claim 18 wherein the structured surface is higher than the thickness of the dense base prior to any plated material being added.

20. The laminated product of claim 18 wherein the structured surface is higher than more than twice the thickness of the dense base prior to any plated material being added.

21. The laminated product of claim 18 wherein the diameter of the nanostructures is less than one micron.

22. A method of coating a substrate with a thin film of material that is sensitive to atmospheric gasses, said method comprising:

feeding a fluid that comprises a precursor constituent or precursor constituents of the sensitive material into an inlet end of a small dimension tube means;

feeding hot gasses into an inlet end of a large dimension tube means that surrounds said small dimension tube means, the hot gasses thereby heating said small dimension tube means and the fluid within said small dimension tube means;

releasing the fluid from an outlet end of said small dimension tube means;

disposing said substrate in close proximity to said outlet ends of said large and small dimension tube means; and providing to said large dimension tube means at its outlet end a collar substantially conforming to and disposed parallel to said substrate, said large dimension tube means and said collar thereby defining along with said substrate a deposition zone and a barrier zone; wherein in the deposition zone, the hot gasses from said large dimension tube means causing said precursor constituent or precursor constituents of the fluid released from the outlet end of said small dimension tube means to chemically react and thereby produce the sensitive material that deposits on the substrate as the thin film; and wherein the gases flowing outward from said inner and outer tube means through said barrier zone prohibiting atmospheric gasses from entering the deposition zone and contacting said sensitive thin film material.

23. Apparatus for coating a surface of a substrate wit a thin film of material that is sensitive to atmospheric gases, the apparatus comprising:

first means for conveying fluid from an inlet location to an outlet location through a small dimension region, second means for conveying fluid from an inlet location to an outlet location through a large dimension region that is in surrounding relationship to said small dimension region, means for feeding to the inlet location of said first conveying means a fluid that comprises a precursor constituent or precursor constituents of said thin film material, means for feeding to the inlet location of said second conveying means hot gas to beat the fluid as it passes through said small dimension region and as it is released from the outlet location of said small dimension region, thereby causing said precursor constituent or said precursor constituents to chemically react and form said sensitive material, means, associated with the outlet location of said large dimension region, for defining a gas exhaust pathway, means for disposing the substrate surface in close proximity to the outlet location of said second conveying means and parallel to said exhaust pathway defining means, whereby said second conveying means, said exhaust pathway defining means, and said substrate define a deposition zone in which said sensitive material deposits on the substrate surface to form said thin film and a barrier zone in which exhaust gases flowing outward from the outlet locations of said first and second conveying means prohibit atmospheric gases from entering the deposition zone and contacting the sensitive material.

* * * * *